(12) United States Patent
Shiba

(10) Patent No.: US 6,870,869 B2
(45) Date of Patent: Mar. 22, 2005

(54) SEMICONDUCTOR LASER APPARATUS AND METHOD OF OBSERVING SEMICONDUCTOR LASER APPARATUS

(75) Inventor: Shigemitsu Shiba, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 551 days.

(21) Appl. No.: 09/794,355

(22) Filed: Feb. 28, 2001

(65) Prior Publication Data

US 2001/0046770 A1 Nov. 29, 2001

(30) Foreign Application Priority Data

Mar. 1, 2000 (JP) ........................................ 2000-056102

(51) Int. Cl.[7] ................................................ H01S 5/00
(52) U.S. Cl. ............................ 372/46; 372/46; 372/45; 372/44; 357/434; 357/435; 357/436
(58) Field of Search ............................. 372/46, 45, 44, 372/103, 50; 257/434, 435, 436, 225, 43, 97, 103

(56) References Cited

U.S. PATENT DOCUMENTS 4,747,110 A * 5/1988 Takahashi et al. ............ 372/23
4,755,036 A * 7/1988 Suzuki et al. ................. 372/44
4,894,835 A * 1/1990 Uomi et al. ................... 372/45
6,236,066 B1   5/2001 Shiba
6,291,258 B2 * 9/2001 Kadota .......................... 438/46

* cited by examiner

Primary Examiner—Paul Ip
Assistant Examiner—Delma R Flores Ruiz
(74) Attorney, Agent, or Firm—Fitzpatrick, Cella, Harper & Scinto

(57) ABSTRACT

A semiconductor laser apparatus comprises a semiconductor laser chip disposed on a base through an electrode area, wherein the electrode area comprises at least a first electrode layer having no opening and a second electrode layer having an opening from the semiconductor laser chip side, the second electrode layer is formed of materials different from those of the first electrode layer and the opening of the second electrode layer is shaped in such a manner as to allow observation of a light emitting portion of the semiconductor laser chip by etching the first electrode layer using the second electrode layer as a mask. Another semiconductor laser apparatus comprises first and second electrode areas on the upper surface and the lower surface of the semiconductor laser chip, wherein both the first and the second electrode areas comprise at least the first electrode layer having no opening and the second electrode layer having the opening from the semiconductor laser chip side.

17 Claims, 3 Drawing Sheets

SEMICONDUCTOR LASER APPARATUS AND METHOD OF OBSERVING SEMICONDUCTOR LASER APPARATUS

BACKGROUND OF THE INVENTION

1. Field of the Invention

The present invention relates to a semiconductor laser apparatus and a method of observing a light emitting portion of the semiconductor laser apparatus and, in particular, to a structure of electrodes of a semiconductor laser chip. The present invention is preferably used for the semiconductor laser apparatus utilized for an optical communication device, an optical information reproducing unit and the like and the method of observing the light emitting portion of the semiconductor laser apparatus.

2. Related Background Art

A configuration of a conventional semiconductor laser apparatus is shown in FIG. 8 and FIG. 9. In FIG. 8 and FIG. 9, reference numeral 1 denotes an electrode of an Au wire bonding surface, reference numeral 2 denotes an electrode on the side of a base for a stem, a photodiode and the like, reference numeral 3 denotes a laser diode crystal (laser diode chip), reference numerals 4, 5 denote an anode surface and a cathode surface of the laser diode chip 3, reference numeral 6 denotes a base for stem or a photo diode of a package and the like, reference numeral 7 denotes a light emitting (resonator) portion inside the laser diode chip, reference numeral 8 denotes an AU bonding wire and reference numeral 9 denotes an end surface for emitting a laser beam.

The laser diode chip 3 has the electrode formed on the entireties of the anode surface and the cathode surface 4, 5 and either of the surfaces is connected to the base 6 such as the package stem or the photo diode and the like and, to the other surface, the Au wire 8 is connected so as to make an electrical contact to the outside.

Connecting a power source between the Au wire of the laser diode chip and the package stem or the photo diode as configured above and letting an electric current flow to the laser diode chip 3 excite a laser oscillation at the light emitting (resonator) portion 7 and a laser beam can be obtained from the end surface 9.

It is generally known that in the semiconductor laser apparatus, external electrical stresses such as static electricity or surges cause crystal breakage in the light emitting (resonator) portion of the laser diode chip, and through life deterioration where the light emitting output is lowered according to the applying time of the current to the laser diode chip, crystal trouble develops in the light emitting (resonator) portion.

When the breakage or the trouble develops as above in the light emitting (resonator) portion 7 of the laser diode chip and the light emitting output is lowered, a direct observation of the light emitting (resonator) portion inside the laser diode chip is the effective means by which the cause of the lowering of the light emitting output is studied. However, in case of the above described conventional example as shown in FIG. 8, because the electrode 1 of the laser diode chip is disposed approximately on the whole of the laser diode chip anode surface 4 and also the electrode 2 is similarly formed on the whole of the cathode surface 5 and, moreover, the one side thereof (here, the cathode surface) is fixed to the base of the stem, it was impossible to observe a state of the light emitting (resonator) portion 7 inside the laser diode chip from the upper or the lower direction of the laser diode chip by using an optical microscope or an electron microscope.

In fact, when the observation of the internal light emitting (resonator) portion is to be performed, according to the conventional technology, the emission status can be observed only after the electrode materials are removed by chemical agent and the anode surface or the cathode surface of the laser diode chip is exposed, and then the electrode is formed again in the position where no interference is caused with the observation of the light emitting (resonator) portion and the electrical contact is made.

Therefore, the applicant of the present invention has already filed an application for the structure for observing the light emitting portion inside the laser diode chip by disposing an opening in the electrode 1 (Japanese Patent Application Laid-Open No. 11-274566).

However, it is not always necessary to observe the light emitting portion in a normal using state. Moreover, there are some cases where the light emitting portion 9 in FIG. 8, for example, is separated from the electrode 1 and it is better to observe it from the electrode 2 side. It is, therefore, desirable that when breakage or trouble develops in the light emitting (resonator) portion of the laser diode chip and the light emitting output is lowered, the above-described opening is disposed, as occasion demands, from the base 6 side such as a package or the like so that the internal light emitting portion of the laser diode chip can be observed.

SUMMARY OF THE INVENTION

An object of the present invention is to provide the semiconductor laser apparatus having a laser diode chip electrode structure where the observation of the inside of the laser diode chip can be simply performed, as occasion demands.

The semiconductor laser apparatus according to the present invention is characterized in that a semiconductor laser chip is disposed on the base through an electrode area and the above described electrode area comprises at least a first electrode layer having no opening and a second electrode layer having an opening from the upper semiconductor chip side and the second electrode layer is formed by materials different from those of the first electrode layer and the opening of the second electrode layer etches the first electrode layer with the second electrode layer as a mask so that the light emitting portion of the above described semiconductor laser chip is shaped in such a manner as to be observable.

Moreover, the semiconductor laser apparatus according to the present invention is characterized in that a first and a second electrode area are provided on the upper and the lower surfaces of the semiconductor laser chip and both of the first and the second electrode areas comprise the first electrode layer having no opening and the second electrode layer having an opening from the semiconductor laser chip side and the second electrode layer is formed by materials different from those of the first electrode layer and the opening of the second electrode layer etches the first electrode layer with the second electrode layer as a mask so that the light emitting portion of the above described semiconductor laser chip is shaped in such a manner as to be observable.

The method of observing the light emitting portion of the semiconductor laser apparatus of the present invention is characterized in that it uses the above described semiconductor laser apparatus and, by using the opening of the above described second electrode layer as an etching mask, it etches and opens the above described first electrode layer, thereby observing the above described light emitting portion.

DESCRIPTION OF THE PREFERRED EMBODIMENTS

Hereinafter, the embodiments of the present invention will be described with reference to the drawings.
(Embodiment 1)

Figure 1:
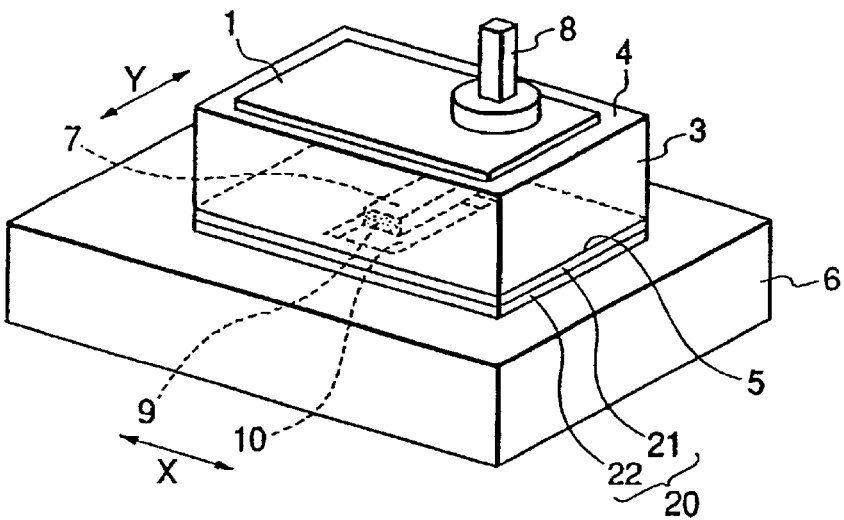
FIG. 1 is a typical perspective view of the semiconductor laser apparatus of a first embodiment of the present invention.
Figure 2:
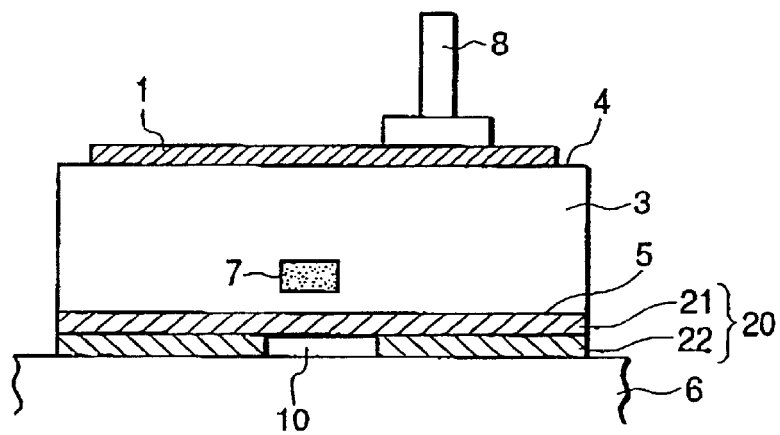
FIG. 2 is a typical cross-sectional view of the semiconductor laser apparatus as shown in FIG. 1.
Figure 8:
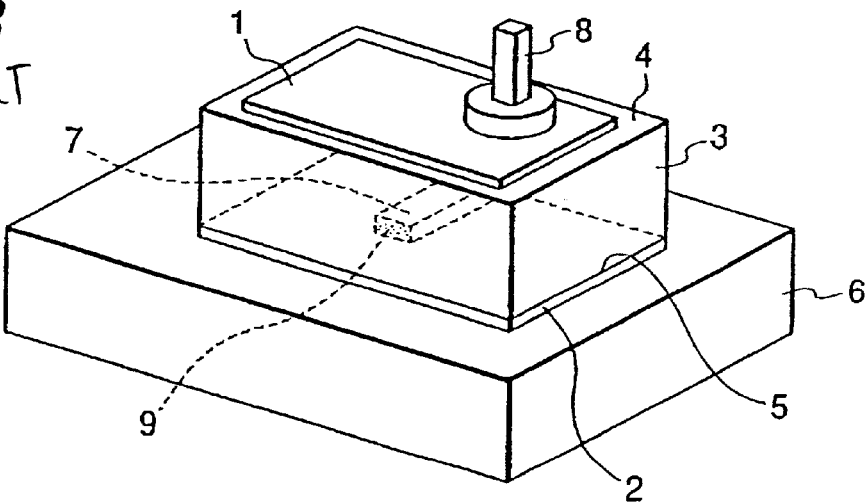
FIG. 8 is a typical perspective view of the semiconductor laser apparatus of the conventional example.
Figure 9:
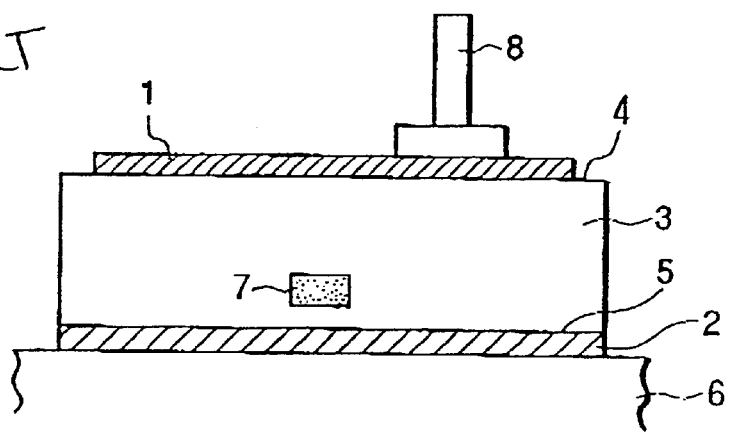
FIG. 9 is a typical perspective view of the semiconductor laser apparatus as shown in FIG. 8.

FIG. 1 is a perspective view showing the semiconductor laser apparatus according to the present invention. FIG. 2 is a cross-sectional view for explaining the structure of FIG. 1. Moreover, in FIG. 1 and FIG. 2, the same reference numerals denote the same components as the components shown in FIG. 8 and FIG. 9. In FIG. 1, though the length of the laser diode chip 3 in the X direction is longer than the length in the Y direction, FIG. 1 is only depicted as a typical arrangement and there are some cases where the length in the X direction is shorter than the length in the Y direction (which is applicable to each drawing to be described hereinafter).

In FIG. 1 and FIG. 2, the electrode 1 of the laser diode chip 3 is formed on the laser diode chip anode surface 4 and an electrode 20 is formed on the laser diode chip cathode surface 5. The electrode 20 is configured by a first electrode layer 21 such as Al (aluminnum) having no opening and the like and a second electrode layer 22 such as Au (gold) having an opening 10. By making the first electrode layer and the second electrode layer to be the electrode structure as described above by using different materials, an etching is performed, as occasion demands, by the second electrode layer 22 as a mask so as to open the first electrode layer 21, thereby enabling to observe the light emitting portion 7. In order to observe the light emitting portion, first, the base 6 is removed. The removal method thereof may be the etching or grinding of the base itself or the melting of glue which glues the base and the electrode 20. Thereafter, by using the etching solvent which is easier to etch the first electrode layer 21 than to etch the second electrode layer 22, the first electrode layer is opened. Note that, as the materials of the electrode, Au, Ti, Ta, Cu, Ma, W, In, Sn, Ag, Pt, Ge or alloys of these materials can be used.

The electrode 1 is supplied with electricity through the Au bonding wire 8, and the electrode 20, by being connected to the base 6 such as the stem or the photo diode and the like, allows the current to flow so as to obtain the laser beam. The laser beam is oscillated in the light emitting (resonator) portion 7 inside the laser diode chip 3 and is emitted from the end surface 9. Note that the cathode surface and the anode surface may be arranged in reverse. That is, the electrode 1 may be arranged on the cathode side and the electrode 20 on the anode side.

Figure 3:
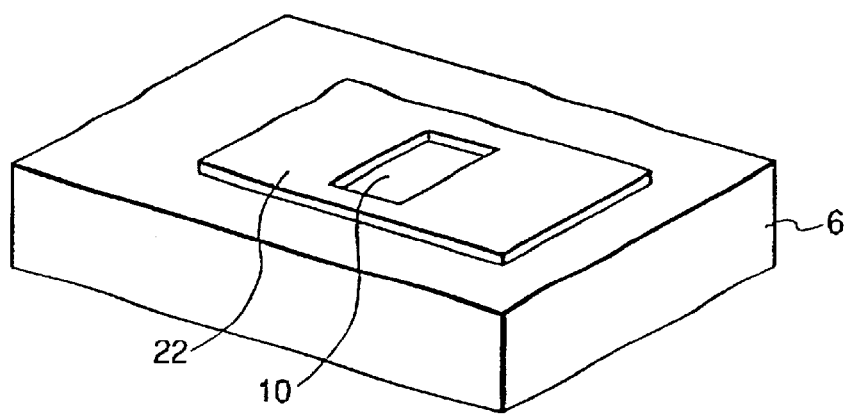
FIG. 3 is a typical perspective view showing a second electrode layer of the semiconductor laser apparatus as shown in FIG. 1.

The shape of the opening 10 of the second electrode layer 22 may take whatever shape, when the second electrode layer 22 is masked and etched so as to open the first electrode layer 21 (when the etching and the opening of the first electrode layer 21 is effected from the opening of the second electrode layer 22), if the light emitting portion 7 is so shaped to be observable through the opening of the first and the second electrode layers 21, 22. However, in the present embodiment, a slit-shaped opening to match the shape of the light emitting portion 7 as shown in FIG. 3 is disposed. FIG. 3 is a perspective view showing the second electrode layer 22 having an opening 10, and the upper components such as the first electrode layer 21, the laser diode chip 3 and the like are omitted.

The electrode materials of the first and the second electrode layers 21, 22 are such that the first electrode layer 21 is higher in etching speed than the second electrode layer 22 and a combination of materials capable of selective etching may be selected.

In the present embodiment, the reason why the opening is disposed against the electrode at the side where the base 6 such as the stem and the photo diode is fixed is because the distance from the anode surface 4 to the light emitting portion 7 is so long that the light beam is difficult to penetrate from the anode surface 4 or even if the opening is disposed from the electrode 1 side, the observation is difficult to perform. However, by taking into consideration the position of the light emitting portion 7 inside the laser diode chip 3 and availability of easy observation, the observation may be performed from the electrode 1 side. In this case, the electrode 1 may be configured in two layers similar to the electrode 20.

Figure 6:
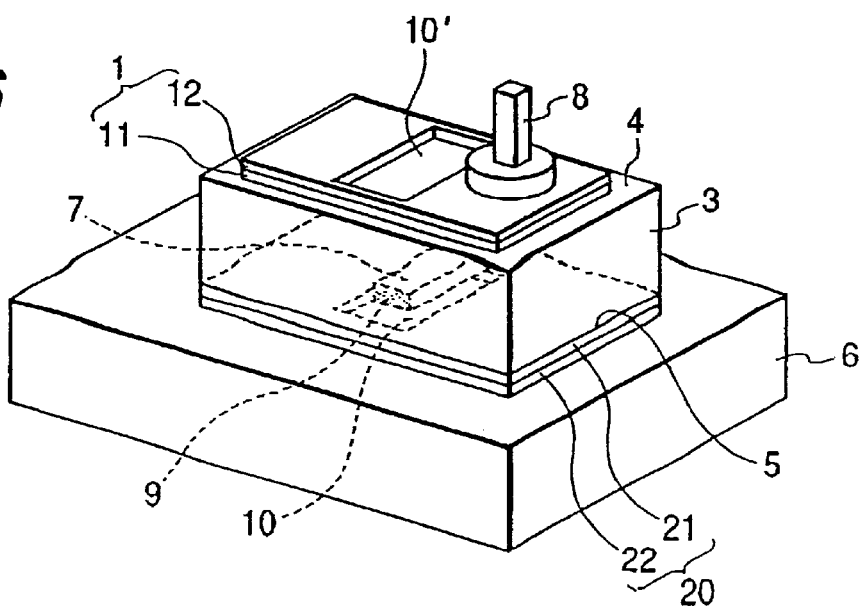
FIG. 6 is a typical perspective view of a modified example of the semiconductor laser apparatus of the first embodiment of the present invention.
Figure 7:
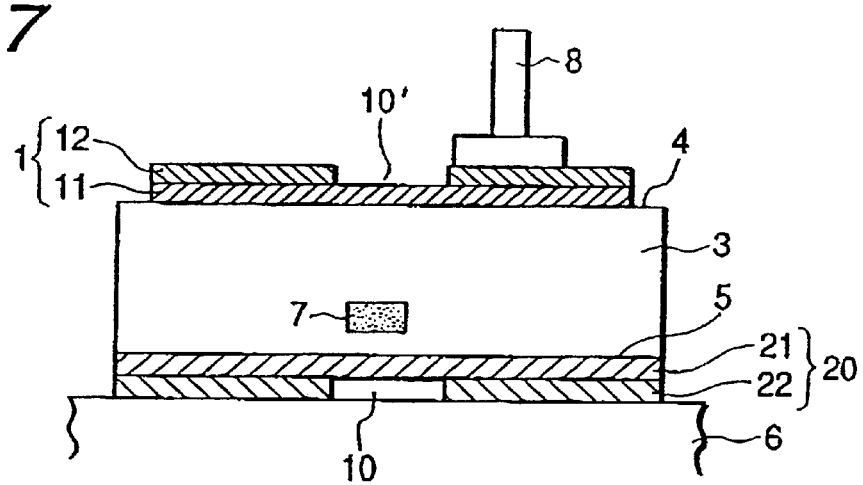
FIG. 7 is a typical perspective view of the semiconductor laser apparatus as shown in FIG. 6.

Moreover, when it is not clear as to which location the breakage or the trouble of the crystal of the light emitting portion 7 occurs, or from which electrodes 1 or 20 the observation should be performed, either of the electrodes 1 or 20 may be configured as an electrode having a two layer structure. The perspective view and the cross-sectional view of the semiconductor laser apparatus in this case are shown in FIG. 6 and FIG. 7. What is different from the configurations of FIG. 1 and FIG. 2 is that the electrode 1, similar to electrode 20, is configured by a first electrode layer 11 such as Al (aluminum) and the like having no opening and a second electrode layer 12 such as AU (gold) and the like having an opening 10. Note that the first electrode layer 21 may be formed on the whole surface of the semiconductor laser chip. configurations of FIG. 1 and FIG. 2 is that the electrode 1, similar to the electrode 20, is configured by a first electrode layer 11 such as Al(aluminum) and the like having no opening and a second electrode layer 12 such as Au (gold) and the like having an opening 10'. Note that the first electrode layer 21 may be formed on the whole surface of the semiconductor laser chip.

When the light emitting portion is desired to be observed through the electrode 20, for example, phosphoric acid is used as the etching liquid and selective etching is performed. At this time, the second electrode layer 22 disposed with an opening becomes a mask so that the first electrode layer 21 is selectively removed, but the electrode materials in the vicinity are not etched. For this reason, while the electrode and Au wire 8 in the vicinity of the opening retain electric contact, the laser diode chip is shaped in such a manner to be exposed along the light emitting (resonator) portion 7, thereby making it possible to observe the laser diode chip. The electrode layer 22 may use Ti or W instead of Au.

Note that the electrode 20 may be configured by the electrode layer having three or more layer structures. For example, the electrode 20 may be configured by the electrode layer having the opening and the electrode layer having more than two layers having no opening. Or in reverse, it may be configured by the electrode layer having more than two layers having the opening and the electrode layer having no opening. Moreover, it may be configured by a plurality of the same number or a different number of electrode layers having the opening and electrode layers having no opening. By combining two kinds of electrode layers such as one or more than two electrode layers having no opening and combining the materials different in etching speeds as each electrode layer, selective etching can be performed in the opening. When such electrode layer having the opening and/or the electrode layer having no opening are formed by the layer having more than two layers different in etching rates, etching liquid or etching gas can be changed according to each layer and the control of etching speeds can be performed. Note that the opening can be made in the shape of a slit.

(Embodiment 2)

Figure 4:
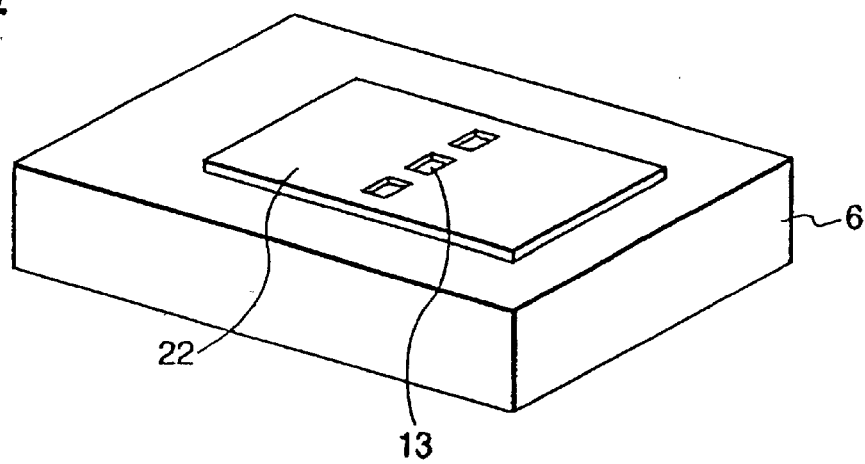
FIG. 4 is a typical perspective view showing the second electrode layer of the semiconductor laser apparatus of a second embodiment of the present invention.

Next, a second embodiment according to the present invention will be shown in FIG. 4. As shown in FIG. 4, by configuring the portion (opening) 13 in the shape of one or a plurality of cells where the electrode materials of the second electrode layer 22 are not formed, an operation current for laser oscillation is allowed to flow uniformly on the whole of the cathode surface 5. Note that in case of the configurations as shown in FIG. 6 and FIG. 7 the similar opening may be disposed on the electrode layer 12.

(Embodiment 3)

Figure 5:
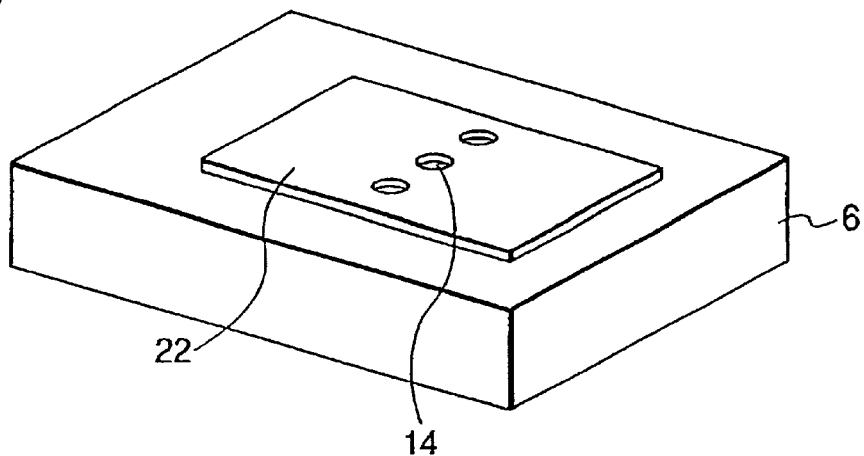
FIG. 5 is a typical perspective view showing the second electrode layer of the semiconductor laser apparatus of a third embodiment of the present invention.

Moreover, a third embodiment according to the present invention will be shown in FIG. 5. As shown in FIG. 5, by configuring the portion (opening) 14 in the shape of a plurality of circles where the electrode materials of the second electrode 22 are not formed, an electrostatic concentration into the four corners of the cell as practiced in the above described second embodiment can be alleviated. Note that in case of the structures as shown in FIG. 6 and FIG. 7, the similar opening may be disposed on the electrode layer 12. In each of the above described embodiments, if there are plural oscillators, by disposing one or a plurality of the openings on the electrode layer so as to be able to observe each light emitting (resonator) portion, the same effect can be obtained.

As described above, according to the present invention, the electrode of the semiconductor laser chip is configured as a multi electrode which takes both an electrode structure disposed with the opening and an electrode structure disposed with no opening so that the electrode surface can be disposed on the whole of the semiconductor laser chip surface in a state of normal use. For this reason, the operation current can be let flow uniformly on the whole of the semiconductor laser chip surface in operation time. When the observation of the light emitting portion is required, the semiconductor laser chip is taken out from the base and, with the chip in a state of being itself alone, the selective etching by chemical etching and the like is performed. Because the etching is performed only on the opening, the observation of the light emitting (resonator) portion of the semiconductor laser chip in an exposed state can be easily performed without forming the electrode again as with the case of the conventional example.

By performing such an observation, when the cause of the troubles such as the lowering of the emitting output of the semiconductor laser apparatus and the like is found inside the semiconductor laser chip, the direct observation of the light emitting (resonator) portion which is the most effective means for studying the cause can be easily performed, making it possible to accurately study the cause of the troubles.

What is claimed is:

1. A semiconductor laser apparatus comprising:

an active laser element; and an electrode area formed on one of an upper surface and a lower surface of said active laser element, wherein said electrode area comprises, from an active laser element side, at least a first electrode layer having no opening and a second electrode layer having an opening, said first and second electrode layers arranged on a same side of said active laser element, and said second electrode layer is formed of materials different from those of said first electrode layer and the opening of said second electrode layer is shaped so as to allow observation of a light emitting portion of said active laser element by etching said first electrode layer using said second electrode layer as a mask.

2. The semiconductor laser apparatus according to claim 1, wherein said first electrode layer is formed on substantially the entire surface of said active laser element.

3. The semiconductor laser apparatus according to claim 1, wherein the opening of said second electrode layer is in the shape of a slit.

4. The semiconductor laser apparatus according to claim 1, wherein plural openings are formed in said second electrode layer.

5. A semiconductor laser apparatus comprising:

an active laser element; and first and second electrode areas formed on an upper surface and a lower surface of said active laser element, wherein both said first and second electrode areas comprise, from an active laser element side, at least a first electrode layer having no opening and a second electrode layer having an opening, and said second electrode layer is formed of materials different from those of said first electrode layer and the opening of said second electrode layer is shaped so as to allow observation of a light emitting portion of said active laser element by etching said first electrode layer using said second electrode layer as a mask.

6. The semiconductor laser apparatus according to claim 5, wherein said first electrode layer is formed on substantially the entire surface of said active laser element.

7. The semiconductor laser apparatus according to claim 5, wherein the opening of said second electrode layer is in the shape of a slit.

8. The semiconductor laser apparatus according to claim 5, wherein plural openings are formed in said second electrode layer.

9. A method of allowing observation of a light emitting portion of a semiconductor laser apparatus, the method comprising the steps of:

assembling a semiconductor laser apparatus comprising an active laser element disposed on an electrode area, wherein the electrode area comprises, from the active laser element side, at least a first electrode layer having no opening and a second electrode layer having an opening, the second electrode layer being formed of materials different from the materials of the first electrode layer, the opening of the second electrode layer being shaped so as to allow observation of the light emitting portion of the active laser element by etching the first electrode layer, and the electrode area being one of a positive electrode and a negative electrode;

using the opening of the second electrode layer as an etching mask; and etching and opening the first electrode layer so as to allow observation of the light emitting portion.

10. A method of allowing observation of a light emitting portion of a semiconductor laser apparatus, wherein the method utilizes the semiconductor laser apparatus according to claim 2 and, by using the opening of the second electrode layer as an etching mask, etches and opens the first electrode layer so as to allow observation of the light emitting portion.

11. A method of allowing observation of a light emitting portion of a semiconductor laser apparatus, wherein the method utilizes the semiconductor laser apparatus according to claim 3 and, by using the opening of the second electrode layer as an etching mask, etches and opens the first electrode layer so as to allow observation of the light emitting portion.

12. A method of allowing observation of a light emitting portion of a semiconductor laser apparatus, wherein the method utilizes the semiconductor laser apparatus according to claim 4 and, by using the opening of the second electrode layer as an etching mask, etches and opens the first electrode layer so as to allow observation of the light emitting portion.

13. A method of allowing observation of a light emitting portion of a semiconductor laser apparatus, wherein the method utilizes the semiconductor laser apparatus according to claim 5 and, by using the opening of the second electrode layer as an etching mask, etches and opens the first electrode layer so as to allow observation of the light emitting portion.

14. A method of allowing observation of a light emitting portion of a semiconductor laser apparatus, wherein the method utilizes the semiconductor laser apparatus according to claim 6 and, by using the opening of the second electrode layer as an etching mask, etches and opens the first electrode layer so as to allow observation of the light emitting portion.

15. A method of allowing observation of a light emitting portion of a semiconductor laser apparatus, wherein the method utilizes the semiconductor laser apparatus according to claim 7 and, by using the opening of the second electrode layer as an etching mask, etches and opens the first electrode layer so as to allow observation of the light emitting portion.

16. A method of allowing observation of a light emitting portion of a semiconductor laser apparatus, wherein the method utilizes the semiconductor laser apparatus according to claim 8 and, by using the opening of the second electrode layer as an etching mask, etches and opens the first electrode layer so as to allow observation of the light emitting portion.

17. A semiconductor laser apparatus comprising:

an active laser element; and an electrode area formed on one of an upper surface and a lower surface of said active laser element, wherein said electrode area comprises, from an active laser element side, at least a first electrode layer having no opening and a second electrode layer having an opening, said first and second electrode layers arranged on a same side of said active laser element, and said second electrode layer is formed of materials different from those of said first electrode layer and the opening of said second electrode layer is shaped so as to allow observation of a light emitting portion of said active laser element.

* * * * *

UNITED STATES PATENT AND TRADEMARK OFFICE
CERTIFICATE OF CORRECTION

PATENT NO. : 6,870,869 B2
DATED : March 22, 2005
INVENTOR(S) : Shigemitsu Shiba

It is certified that error appears in the above-identified patent and that said Letters Patent is hereby corrected as shown below:

Column 1,
Line 65, "surface)is" should read -- surface) is --.

Column 2,
Line 51, "area" should read -- areas --.

Column 3,
Line 51, "Al (aluminnum)" should read -- Al (aluminum) --.

Column 4,
Line 57, "configurations of FIG. 1 and FIG. 2 is that the" should be deleted; and
Lines 58-63, should be deleted.

Signed and Sealed this

Twenty-sixth Day of July, 2005

JON W. DUDAS
*Director of the United States Patent and Trademark Office*